United States Patent [19]

Dennison et al.

[11] Patent Number: 5,292,683

[45] Date of Patent: Mar. 8, 1994

[54] METHOD OF ISOLATING SEMICONDUCTOR DEVICES AND ARRAYS OF MEMORY INTEGRATED CIRCUITRY

[75] Inventors: Charles H. Dennison; Trung T. Doan, both of Boise, Id.

[73] Assignee: Micron Semiconductor, Inc., Boise, Id.

[21] Appl. No.: 71,752

[22] Filed: Jun. 9, 1993

[51] Int. Cl.$^5$ .............................. H01L 21/304
[52] U.S. Cl. ......................... 437/63; 437/60; 148/DIG. 50
[58] Field of Search ............ 437/47, 60, 63, 64, 437/69, 919; 148/DIG. 14, DIG. 50

[56] References Cited

U.S. PATENT DOCUMENTS

| | | | |
|---|---|---|---|
| 5,057,444 | 10/1991 | Fuse et al. | 437/74 |
| 5,112,772 | 5/1992 | Wilson et al. | 437/63 |
| 5,229,316 | 7/1993 | Lee et al. | 148/DIG. 50 |
| 5,250,456 | 10/1993 | Bryant | 437/60 |

Primary Examiner—Brian E. Hearn
Assistant Examiner—Chandra Chaudhari
Attorney, Agent, or Firm—Wells, St. John, Roberts, Gregory & Matkin

[57] ABSTRACT

A semiconductor processing device isolation method includes: a) providing non-LOCOS insulating device isolation blocks by trench and refill technique on a substrate to define recessed moat volume therebetween; b) providing gate dielectric within the moat volume; c) providing a layer of electrically conductive material over the substrate and gate dielectric to a thickness sufficient to completely fill the moat volume between adjacent isolation blocks; d) chemical-mechanical polishing the layer of electrically conductive material to provide a planarized upper electrically conductive material surface; e) photopatterning and etching the layer of electrically conductive material to provide an electrically conductive runner which overlies a plurality of the isolation blocks and to selectively remove the electrically conductive material from within selected regions of moat volume to define field effect transistor gates within the moat volume; and f) providing conductivity enhancing impurity through the selected regions of moat volume into the substrate to define source-/drain regions adjacent the field effect transistor gates. The invention also includes an array of memory integrated circuitry.

14 Claims, 9 Drawing Sheets

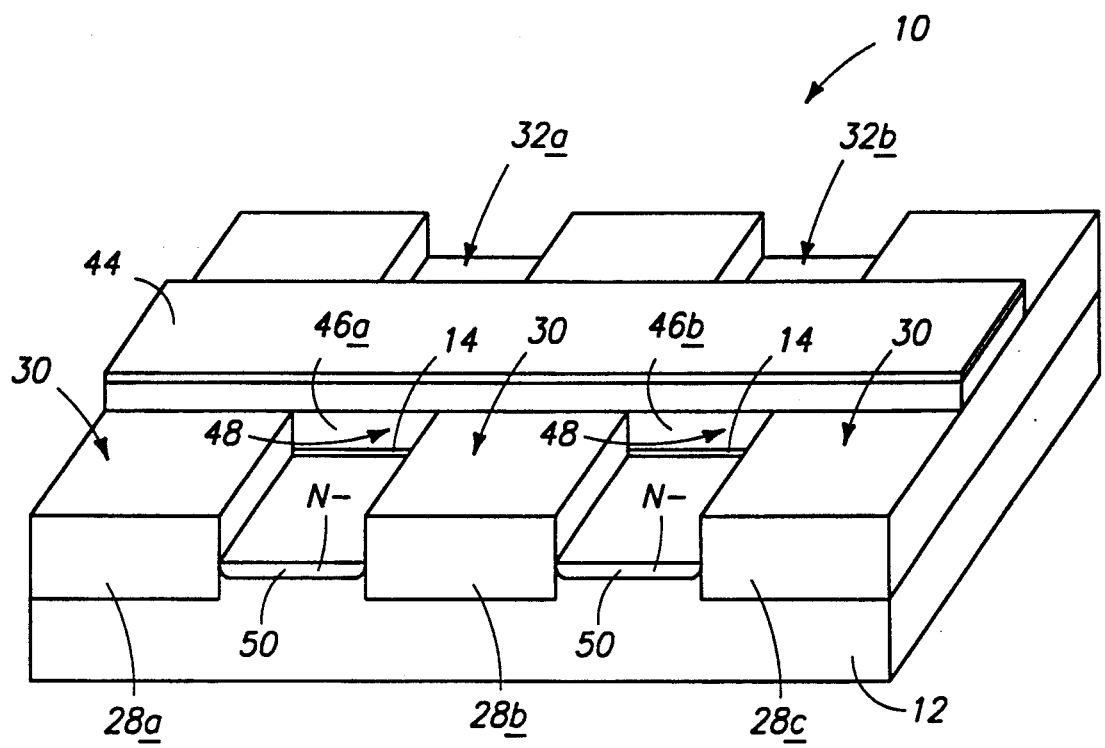
_FIG 9_
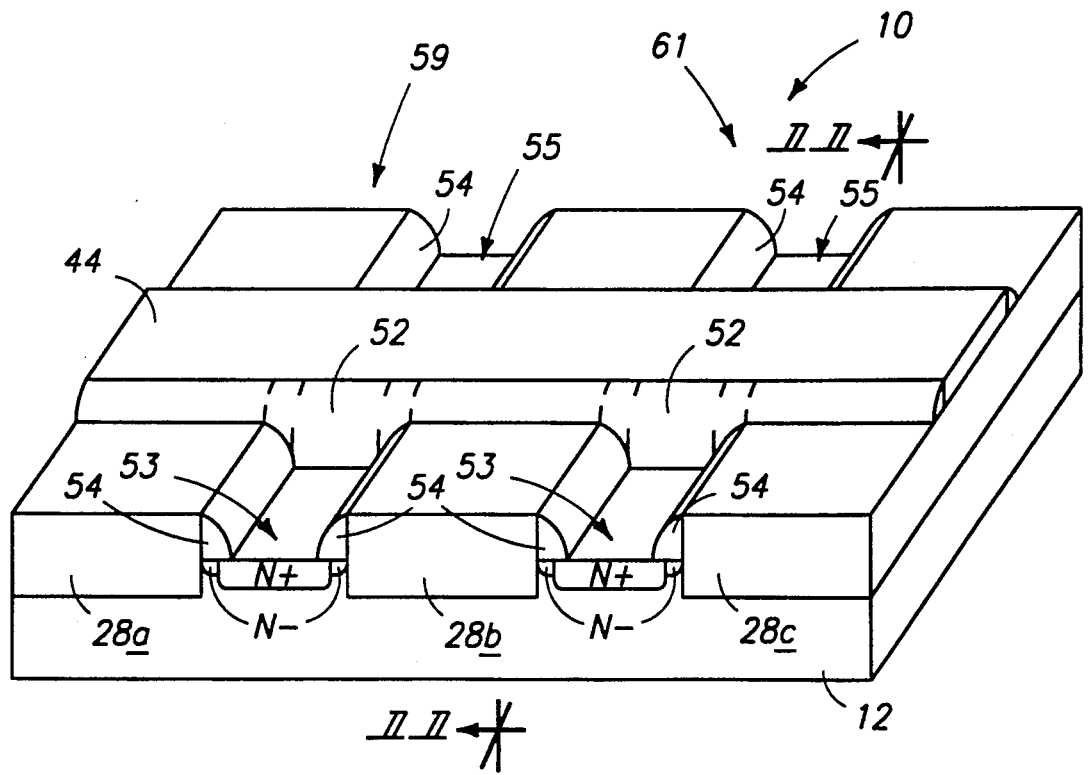
_FIG 10_

5,292,683

METHOD OF ISOLATING SEMICONDUCTOR DEVICES AND ARRAYS OF MEMORY INTEGRATED CIRCUITRY

TECHNICAL FIELD

This invention relates to isolation technologies for integrated circuits and to memory arrays.

BACKGROUND OF THE INVENTION

Implementing electric circuits involves connecting isolated circuit components, alternately termed devices, through specific electrical paths. When fabricating integrated circuits into a semiconductor substrate, it must be possible to electrically isolate devices within the substrate from other devices within the substrate. The devices are subsequently interconnected to create specific desired circuit configurations.

One common technique for isolating devices is referred to as LOCOS Isolation (for LOCal Oxidation of Silicon), which involves the formation of a semi-recessed oxide in the non-active (or field) areas of the bulk substrate. Such oxide is typically thermally grown by means of wet oxidation of the bulk silicon substrate at temperatures of around 1000° C. for two to four hours. The oxide grows where there is no masking material over other silicon areas on the substrate. A typical masking material used to cover areas where field oxide is not desired is nitride, such as $Si_3N_4$.

However, at the edges of a nitride mask, some of the oxidant also diffuses laterally immediately therebeneath. This causes oxide to grow under and lift the nitride edges. The shape of the oxide at the nitride edges is that of a slowly tapering oxide wedge that merges into a previously formed thin layer of pad oxide, and has been termed as a "bird's beak". The bird's beak is essentially a lateral extension of the field oxide into the active areas of devices.

Conventional LOCOS for submicron technologies has numerous limitations. First, the bird's beak structure causes an unacceptably large encroachment of the field oxide into the device active regions. Second, boron from the typical channel-stop implant of n-channel MOSFETs is excessively redistributed during the field-oxide growth and other high-temperature steps, leading to unacceptable narrow-width effects. Third, the planarity of the resultant surface topology with LOCOS is inadequate for submicron lithography needs.

Oxide trench and refill techniques have been utilized to overcome drawbacks of conventional LOCOS. Such typically provides trenches into the substrate which are then filled with chemical vapor deposited (CVD) $SiO_2$. The CVD $SiO_2$ layer is then etched back to yield a planar surface.

It would be desirable to improve upon existing isolation technique.

BRIEF DESCRIPTION OF THE DRAWINGS

Preferred embodiments of the invention are described below with reference to the following drawings.

FIG. 9 is an isometric view of the FIG. 1 wafer fragment taken at a processing step subsequent to that shown by FIG. 8.

FIG. 10 is an isometric view of the FIG. 1 wafer fragment taken at a processing step subsequent to that shown by FIG. 9.

DETAILED DESCRIPTION OF THE PREFERRED EMBODIMENTS

Figure 1:
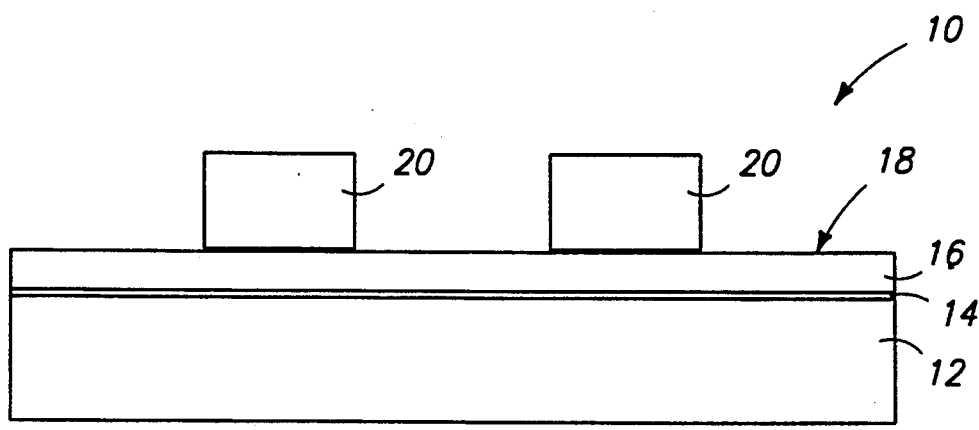
FIG. 1 is a sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing device isolation method comprises the following steps:

providing non-LOCOS insulating device isolation blocks by trench and refill technique on a substrate, the device isolation blocks having an outer surface and being laterally spaced from one another to provide outwardly open and recessed moat volume therebetween;

providing gate dielectric within the moat volume between adjacent isolation blocks;

providing a layer of electrically conductive material over the substrate and gate dielectric to a thickness sufficient to completely fill the moat volume between adjacent isolation blocks;

chemical-mechanical polishing the layer of electrically conductive material to provide a planarized upper electrically conductive material surface;

photopatterning and etching the layer of electrically conductive material to provide an electrically conductive runner which overlies a plurality of the isolation blocks and to selectively remove the electrically conductive material from within selected regions of moat volume to define field effect transistor gates within the moat volume; and providing conductivity enhancing impurity through the selected regions of moat volume into the substrate to define source/drain regions adjacent the field effect transistor gates.

In accordance with another aspect of the invention, an array of memory integrated circuitry comprises:

non-LOCOS insulating device isolation blocks provided on a substrate, the device isolation blocks having an outer surface and being laterally spaced from one another to provide respective recessed moat volume therebetween;

a word line of varying thickness across the array, the word line having a substantially planar upper region within the array, the planar upper region overlying the outer surface of the device isolation blocks, the word line having gate regions projecting from the substantially planar upper region inwardly toward the substrate within the respective recessed moat volumes;

source/drain regions within the substrate adjacent the gate regions; and capacitors and bit lines electrically associated with the source/drain regions.

In still a further aspect of the invention, an array of memory integrated circuitry comprises:

non-LOCOS insulating device isolation blocks provided on a substrate, the device isolation blocks having an outer surface and being laterally spaced from one another to provide respective recessed moat volume therebetween, the device isolation blocks having substantially vertical edges lining the moat volumes;

a word line of varying thickness across the array, the word line having a substantially planar upper region within the array, the planar upper region overlying the outer surface of the device isolation blocks, the word line having gate regions projecting from the substantially planar upper region inwardly toward the substrate within the respective recessed moat volumes, the gate regions having substantially vertical edges within the respective moat volumes;

sidewall spacers over the device isolation block edges within the respective moat volumes;

sidewall spacers over the gate region edges within the respective moat volumes;

source/drain regions within the substrate inwardly adjacent the side wall spacers covering the device isolation block edges and the sidewall spacers covering the gate region edges; and capacitors and bit lines electrically associated with the source/drain regions.

Other aspects of the invention will be readily understood from the following discussion. Referring first to FIG. 1, a silicon wafer 10 at a processing step in accordance with the invention is indicated generally with reference numeral 10. Such includes a bulk substrate region 12. A layer 14 of pad oxide is provided atop substrate 12 either by deposition or more preferably by exposure to oxidizing conditions. A typical thickness for layer 14 would be 200 Angstroms. A sacrificial layer 16 of a first material is provided atop layer 14 and defines an outer surface 18. The preferred material of layer 16 is $Si_3N_4$. A typical thickness for layer 16 will be 2,000 Angstroms. A layer of photoresist 20 is then deposited and patterned, as shown.

Figure 2:
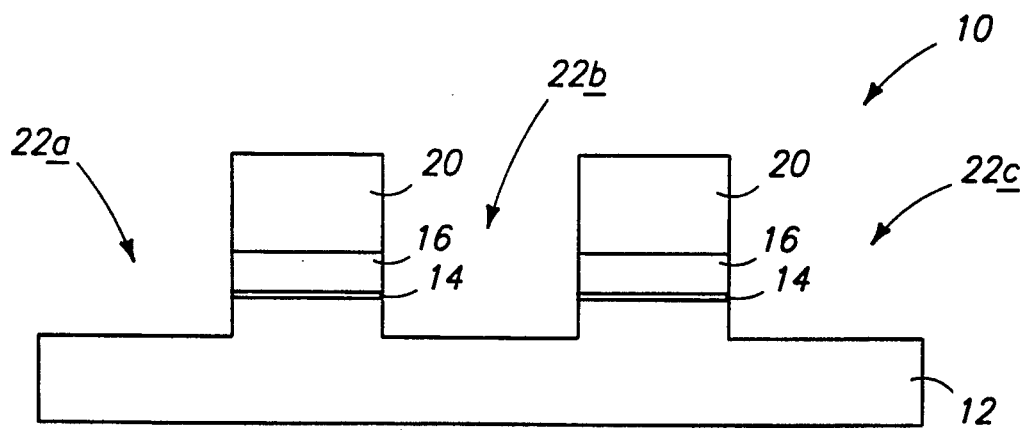
FIG. 2 is a view of the FIG. 1 wafer fragment taken at a processing step subsequent to that shown by FIG. 1.

Referring to FIG. 2, sacrificial layer 16 and pad oxide layer 14 are etched, with etching continuing into substrate 12 preferably by at least 2,500 Angstroms, to define isolation moats 22a, 22b, and 22c. A field implant step could be conducted at this point, such as a p-type medium dose, to improve subsequent isolation within bulk substrate 12.

Figure 3:
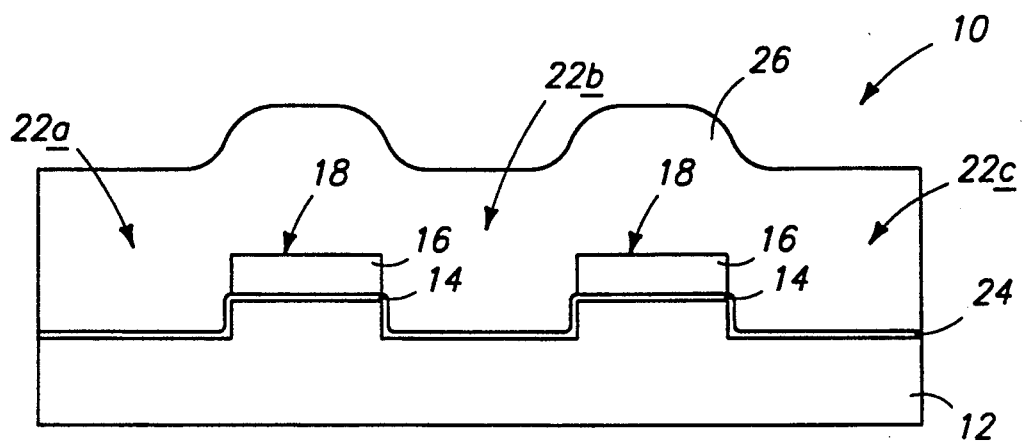
FIG. 3 is a view of the FIG. 1 wafer fragment taken at a processing step subsequent to that shown by FIG. 2.

Referring to FIG. 3, remaining portions of resist layer 20 (no longer shown) are stripped from the wafer. A thin layer 24 of $SiO_2$ is thermally grown over exposed areas of substrate 12. Subsequently, an insulating layer 26 (preferably CVD $SiO_2$) is deposited atop patterned and etched sacrificial layer 16 and thermally grown oxide 24 to a thickness sufficient to completely fill isolation moats 22a, 22b and 22c. Insulating material of layer 26 is of a different composition from the first material of layer 16, and preferably comprises chemical vapor deposited (CVD) $SiO_2$. Thermally grown oxide layer 24 serves the function of passivating the silicon surfaces of bulk substrate 12 from the subsequently deposited CVD oxide 26.

Figure 4:
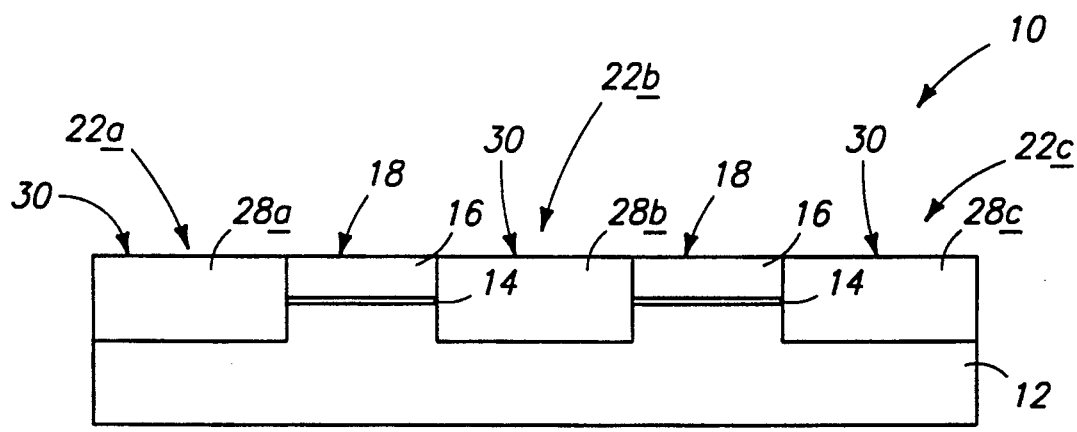
FIG. 4 is a view of the FIG. 1 wafer fragment taken at a processing step subsequent to that shown by FIG. 3.

Referring to FIG. 4, insulating material of layer 26 is chemical-mechanical polished at least to outer surfaces 18 of patterned and etched sacrificial layer 16 to define insulating non-LOCOS device isolation blocks 28a, 28b and 28c. Accordingly, the device isolation blocks fill the isolation moats. Material of layer 16 is preferably different than material of deposited layer 26 such that material 16 provides a suitable CMP stopping platform. An example CMP slurry for this process would be KOH based. For purposes of the continuing discussion, device isolation blocks 28a, 28b and 28c have an outer surface 30 and are laterally spaced from one another.

Figure 5:
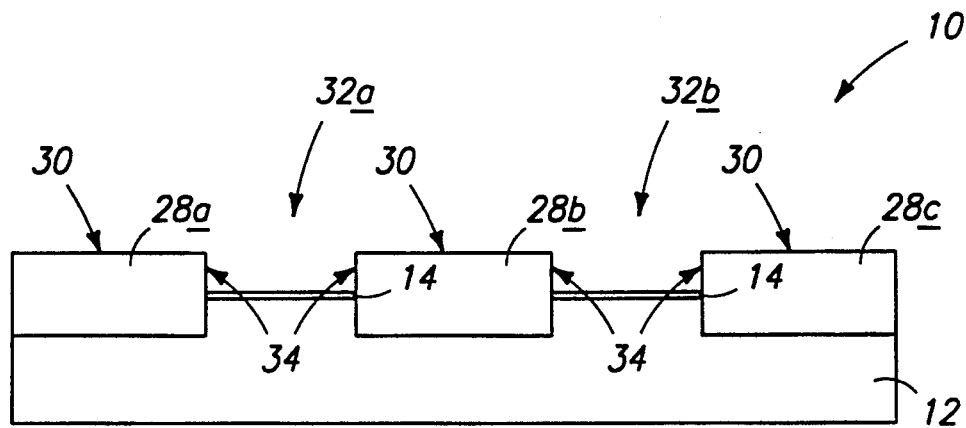
FIG. 5 is a view of the FIG. 1 wafer fragment taken at a processing step subsequent to that shown by FIG. 4.

Referring to FIG. 5, remaining portions of sacrificial nitride layer 16 are etched from the substrate to provide outwardly open and recessed respective moat volumes 32a and 32b. Previously formed oxide layer 14 can be stripped and regrown to be used later as gate oxide. Alternately but less preferred, initial pad oxide layer 14 can be utilized as gate oxide. Thus, gate dielectric 14 is provided within the moat volume between adjacent isolation blocks. For purposes of the continuing discussion, device isolation blocks 28a and 28b have substantially vertical edges 34 lining the respective moat volumes.

Figure 6:
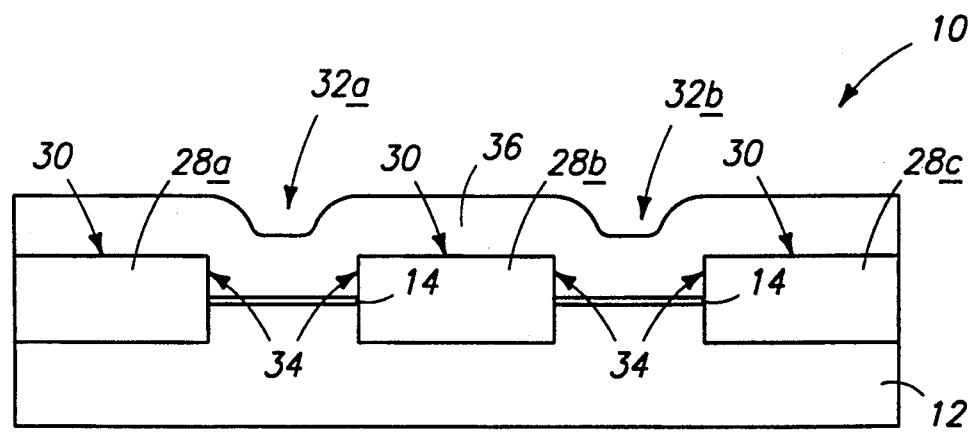
FIG. 6 is a view of the FIG. 1 wafer fragment taken at a processing step subsequent to that shown by FIG. 5.

Referring to FIG. 6, a first layer of electrically conductive material 36 is provided over the substrate and gate dielectric 14 to a thickness sufficient to completely fill the respective moat volumes between adjacent isolation blocks. In the context of this document, "electrically conductive material" means a material which is inherently conductive or capable of being rendered electrically conductive. A preferred material for layer 36 is polysilicon, either rendered conductive by in situ doping or by doping after deposition.

Figure 7:
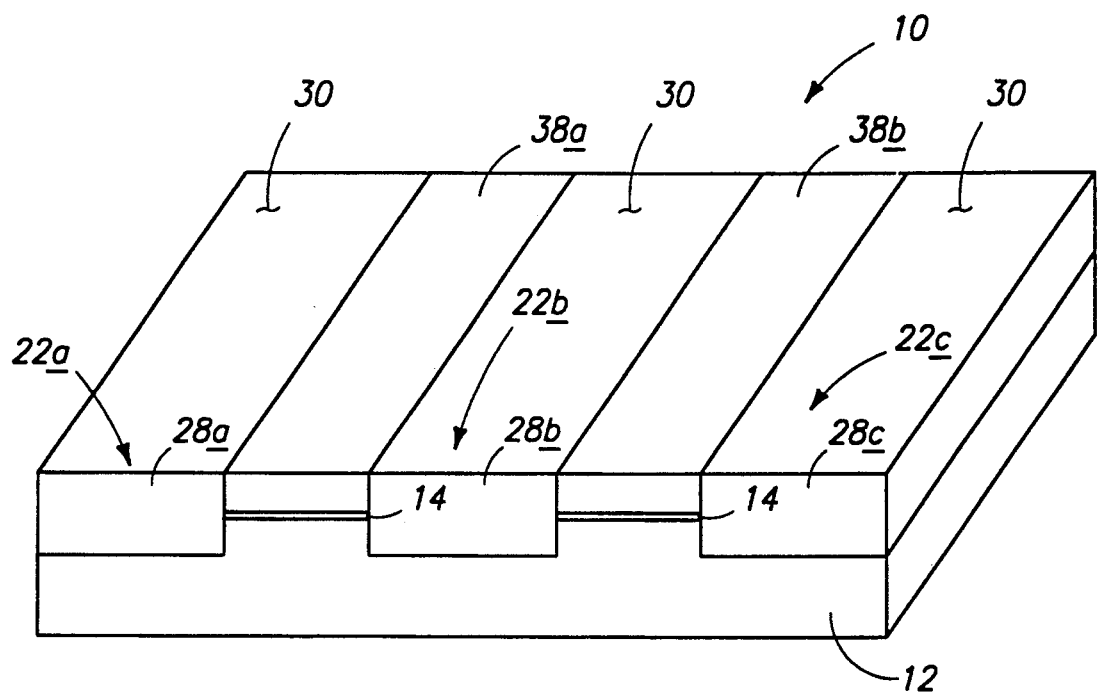
FIG. 7 is an isometric view of the FIG. 1 wafer fragment taken at a processing step subsequent to that shown by FIG. 6.

Referring to FIG. 7, first layer of electrically conductive material 36 is chemical-mechanical polished at least to the device isolation block outer surfaces 30 to define conductive blocks 38a and 38b which are within the respective moat volumes interposed between adjacent device isolation blocks. Thus and alternately considered, electrically conductive layer 36 is chemical-mechanical polished to provide a planarized upper electrically conductive material surface.

Figure 8:
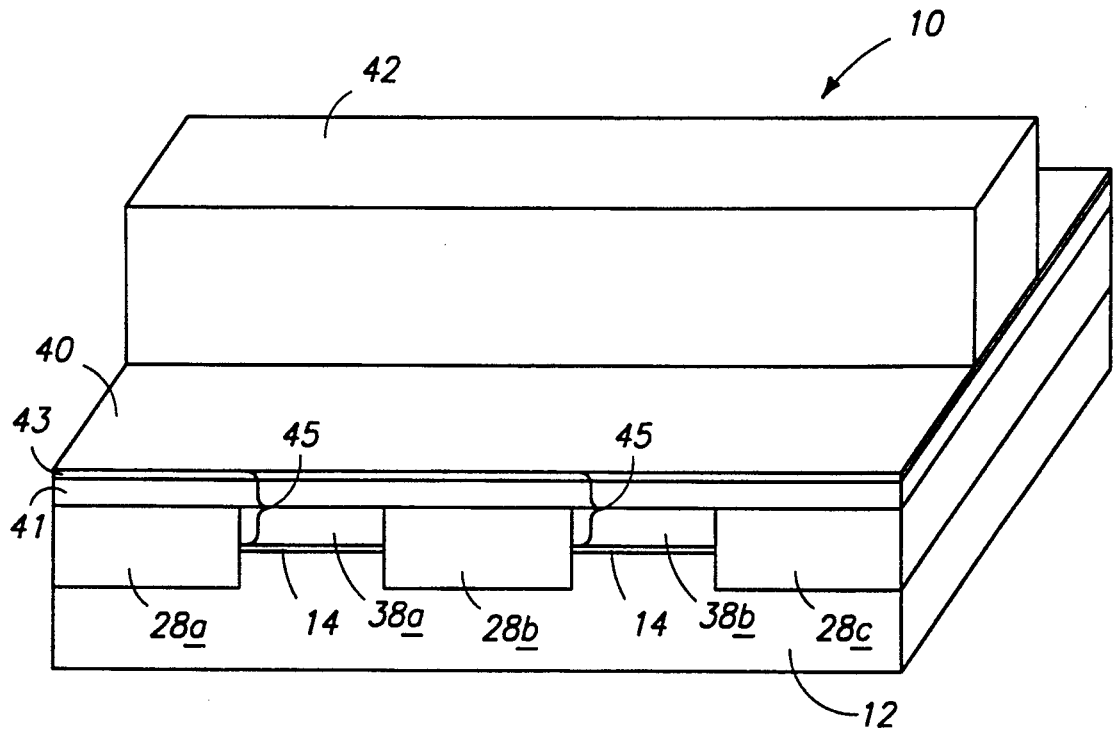
FIG. 8 is an isometric view of the FIG. 1 wafer fragment taken at a processing step subsequent to that shown by FIG. 7.

Referring to FIG. 8, a second layer of electrically conductive material 40 is provided atop conductive blocks 38 and device isolation blocks 28a, 28b and 28c. Layer 40 preferably comprises a composite layer 40 of polysilicon 41 having an overlying layer of a silicide 43, such as WSi$_x$. Alternately, layer 40 could comprise some other conductive material, such as tungsten or for example be entirely composed of TiSi$_x$. Layers 38 and 40 in combination can be considered as an overall composite layer 45 of electrically conductive material. Thereafter, a layer of photoresist 42 is provided and patterned as shown.

Referring to FIG. 9, patterned second layer of electrically conductive material 40 (alternately considered, composite layer 45) and subsequently exposed areas of conductive blocks 38a and 38b are etched to provide an electrically conductive runner 44 which overlies a plurality of the isolation blocks, and to selectively remove first conductive layer material 26 from within selected regions of moat volumes 32a and 32b. Such defines field effect transistor gates 46a and 46b within moat volumes 32a and 32b, respectively. Thus, field effect transistor gates 46a and 46b are received within respective moat volume between adjacent device isolation blocks, and in combination with gate oxide 14 extend from substrate 12 to an elevation which is substantially coincident with device isolation block outer surfaces 30. As shown, second layer of conductive material 40 is patterned and etched to define electrically conductive runner 44 as having a longitudinal extent which runs substantially laterally relative to device isolation blocks 28a, 28b and 28c.

Electrically conductive runner 44, alternate termed word line runner 44 in the context of a memory array, is substantially planar within the array, and overlies and electrically connects with a series of field effect transistor gates, such as gates 46a and 46b as shown. Alternately considered, runner 44 and the field effect transistor gates, such as 46a and 46b, constitute in combination a word line construction of varying thickness across the array. Such word line can be considered as having a substantially planar upper region, in the form of region 40 overlying outer surfaces 30 of the device isolation blocks. Further, such word line construction can be considered as having gate regions, such as regions 46a and 46b, which project from substantially planar region 44 inwardly toward substrate 12 within the respective recessed moat volumes 32a and 32b. For purposes of the continuing discussion, field effect transistor gates 46a and 46b have substantially vertical edges 48.

A conductivity enhancing impurity is provided to a first concentration into substrate 12, such as to produce the illustrated n-regions 50 adjacent the gates.

Referring to FIG. 10, an insulating layer is deposited over the substrate, and an anisotropic spacer etch conducted of such insulating layer to form sidewall spacers 52 over field effect transistor gate edges 48 and to form sidewall spacers 54 over device isolation block edges 34 within the respective moat volumes. Then, a conductivity enhancing impurity is provided to a second concentration into substrate 12 to substantially complete definition of a source 53 and drain 55 adjacent field effect transistor gates 46a and 46b. The second concentration will be greater than the first concentration, with an n+ implant being shown. Thus adjacent field effect transistors 59 and 61 are formed.

During the providing of such impurity, sidewall spacers 54 over the device isolation blocks effectively space the higher concentration source/drain areas of adjacent transistors 59 and 61 further from one another than were the device isolation block spacers not provided, thus providing field isolation within substrate 12.

Figure 11:
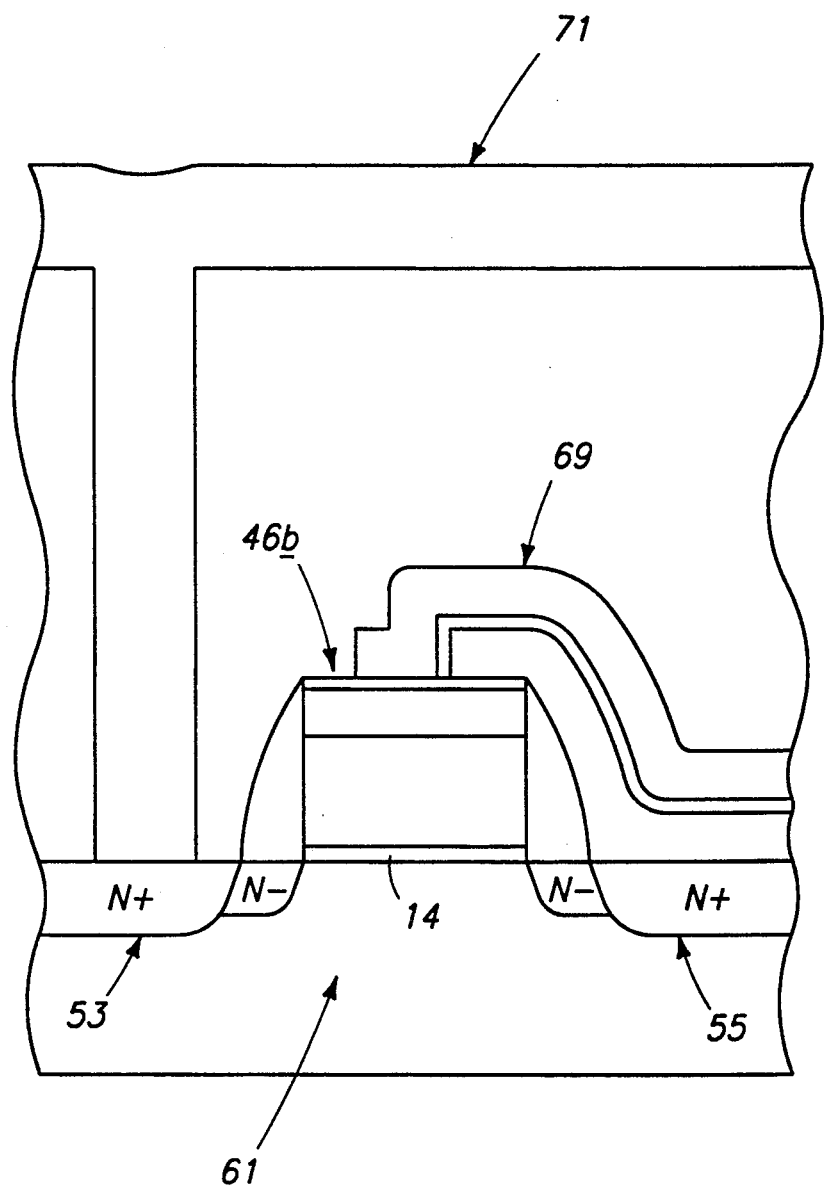
FIG. 11 is an enlarged sectional view of the FIG. 1 wafer fragment taken at a processing step subsequent to that shown by FIG. 10.

Referring to FIG. 11, capacitor and bit line constructions 69 and 71 respectively, are provided and electrically connected with the illustrated source/drain regions 53 and 55, respectively.

Figure 12:
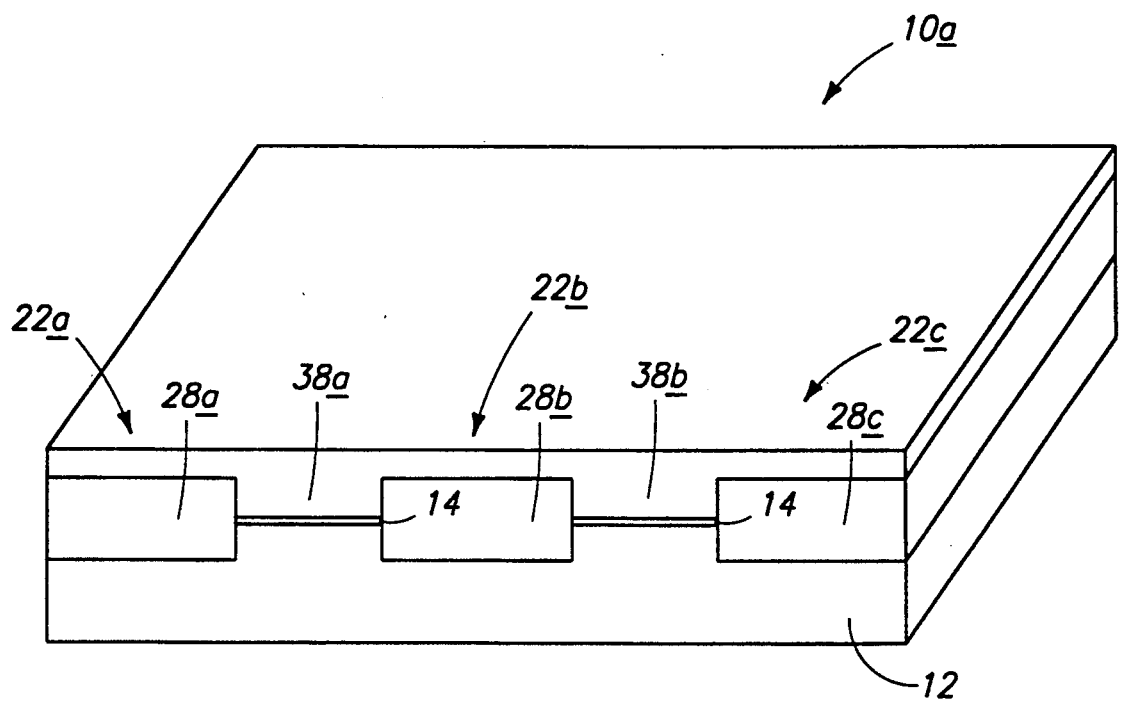
FIG. 12 is an isometric view of an alternate embodiment wafer fragment processed in accordance with the invention.
Figure 13:
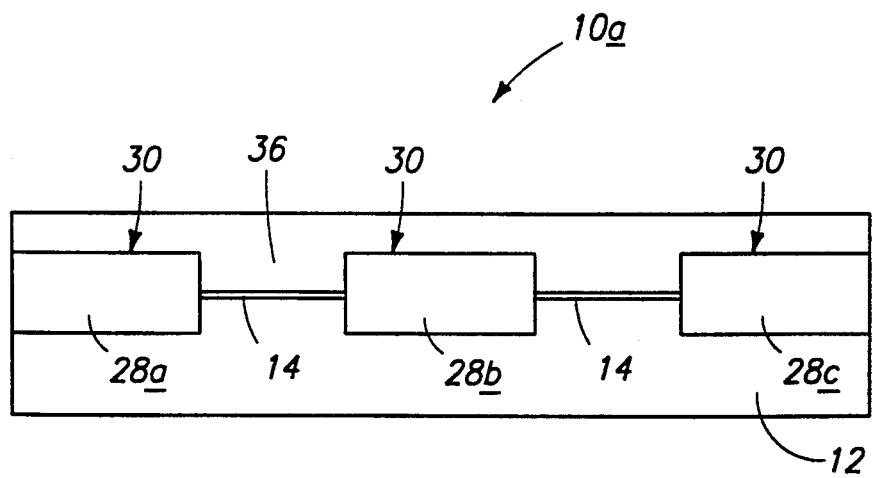
FIG. 13 is a sectional view of the FIG. 12 wafer fragment.

Alternate preferred embodiment aspects of the invention are described with reference to FIGS. 12-17. Referring first to FIGS. 12 and 13, such illustrate a wafer fragment 10a at a processing step corresponding is sequence to, but differing from, that shown by FIG. 7 in the first described embodiment. Here, electrically conductive material layer 36 is not chemical-mechanically polished all the way to device isolation block outer surfaces 30, but rather is only partially polished downwardly relative to such surfaces 30. Thus, an alternate method of providing a planarized upper electrically conductive material surface is shown by way of example.

Figure 14:
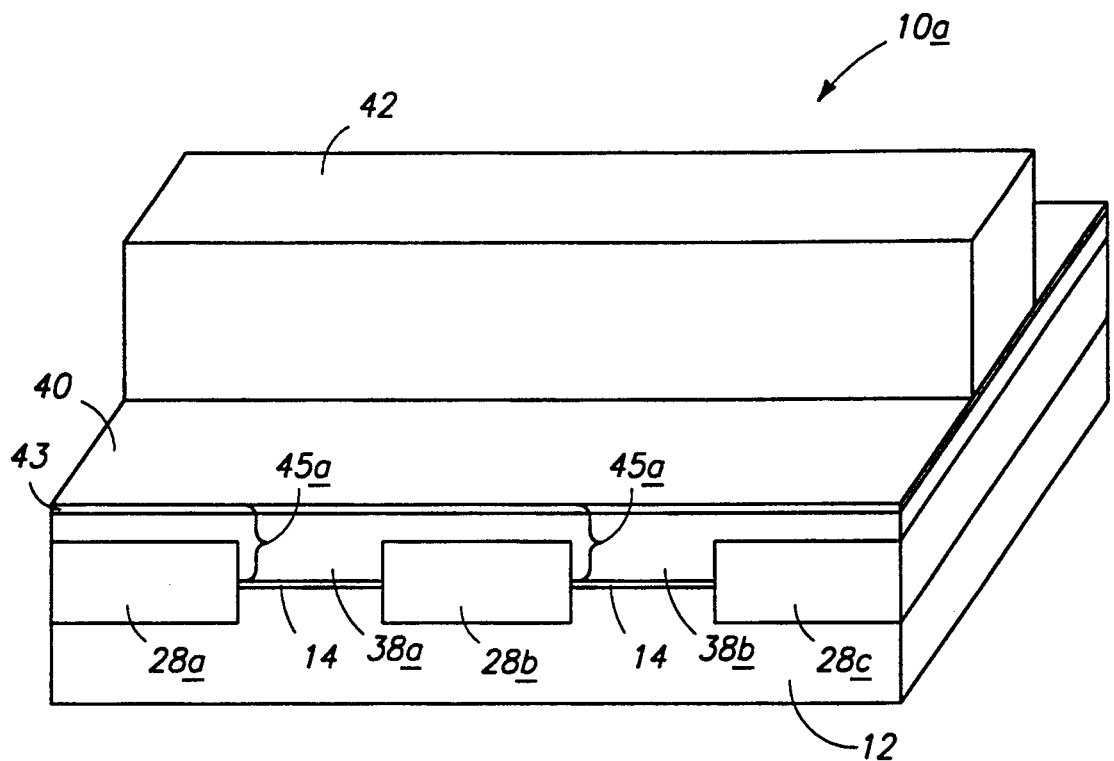
FIG. 14 is an isometric view of the FIG. 12 wafer fragment taken at a processing step subsequent to that shown by FIGS. 12 and 13.

Referring to FIG. 14, an overlying layer of a silicide 43, such as WSi$_x$, is provided. Such results in an overall composite electrically conductive layer 45a. Thereafter, a layer of photoresist 42 is provided and patterned as shown.

Figure 15:
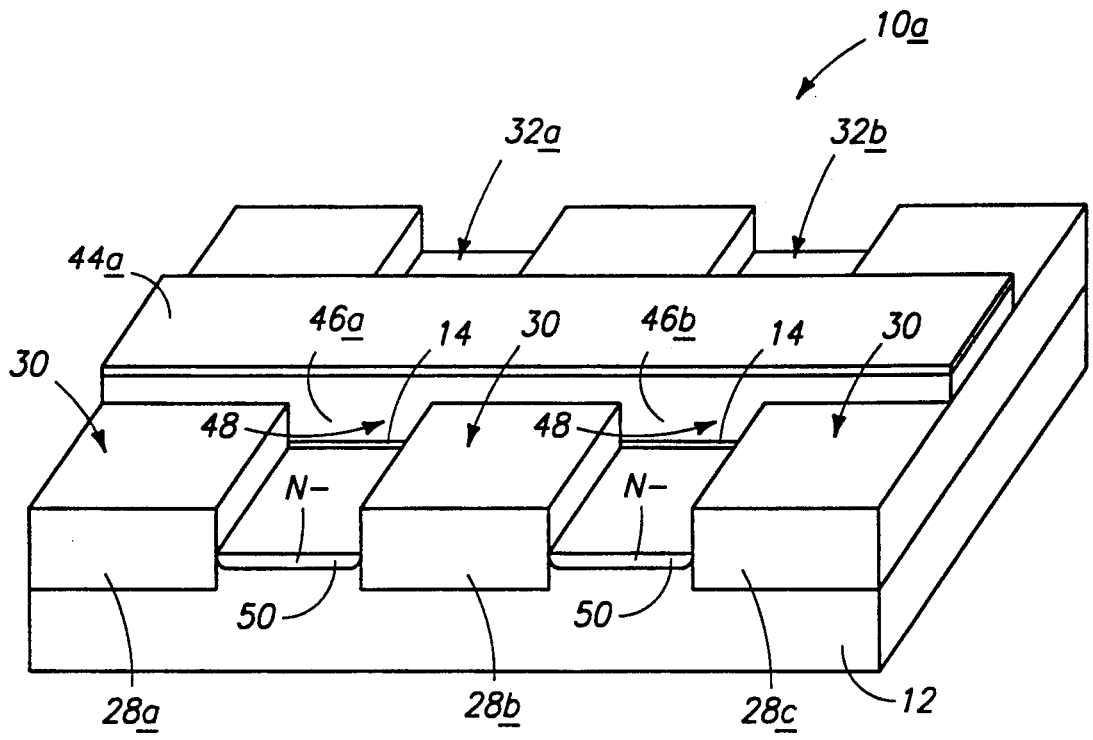
FIG. 15 is an isometric view of the FIG. 12 wafer fragment taken at a processing step subsequent to that shown by FIG. 14.

Referring to FIG. 15, layer 45a and subsequently exposed areas of conductive block regions 38a and 38b are etched to provide an electrically conductive runner 44a which overlies a plurality of the isolation blocks, and to selectively remove first conductive layer material 26 from within selected regions of moat volumes 32a and 32b. Such defines field effect transistor gates 46a and 46b within moat volumes 32a and 32b, respectively. Thus, field effect transistor gates 46a and 46b are received within respective moat volume between adjacent device isolation blocks, and in combination with gate oxide 14 extend from substrate 12 to an elevation which is substantially coincident with device isolation block outer surfaces 30.

A conductivity enhancing impurity is provided to a first concentration into substrate 12, such as to produce the illustrated n-regions 50 adjacent the gates.

Figure 16:
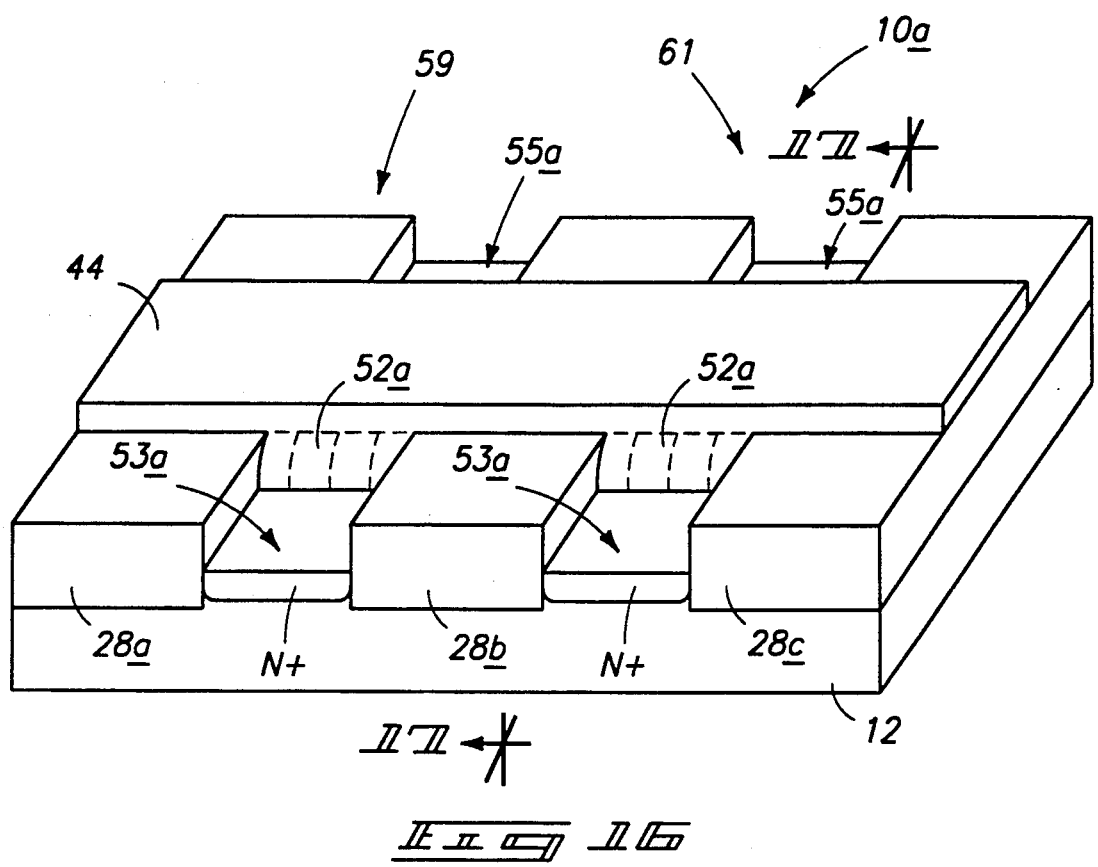
FIG. 16 is an isometric view of the FIG. 12 wafer fragment taken at a processing step subsequent to that shown by FIG. 15.
Figure 17:
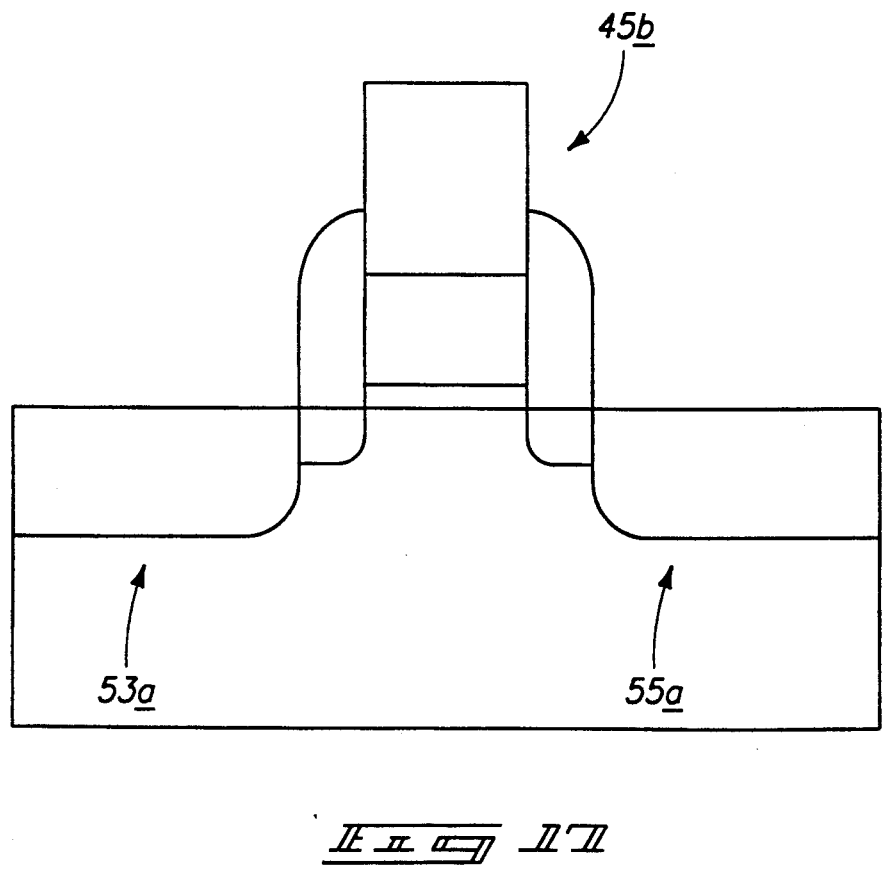
FIG. 17 is a sectional view of the FIG. 16 wafer fragment taken along line 17—17 in FIG. 16.

Referring to FIG. 16, an insulating layer is deposited over the substrate, and an anisotropic spacer etch conducted of such insulating layer. The spacer etch is, however, shown differently than that shown by FIG. 10 of the first described embodiment. Here, a spacer overetch is conducted to a degree sufficient to only leave sidewall spacers 52a about or over the trench area field effect transistor gate edges 48. Then, a conductivity enhancing impurity is provided to a second concentration into substrate 12 to substantially complete definition of a source 53a and drain 55a adjacent field effect transistor gates 46a and 46b. The second concentration will be greater than the first concentration, with an n+ implant being shown. A difference and potential advantage with this aspect of this embodiment as compared to the first described embodiment is greater n+ active area for transistors 46a and 46b. A potential disadvantage is closer positioning and therefore less isolation of n+ areas of adjacent transistors.

The invention also includes arrays of memory integrated circuitry having constructions as defined above.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing device isolation method comprising:
   providing non-LOCOS insulating device isolation blocks by trench and refill technique on a substrate, the device isolation blocks having an outer surface and being laterally spaced from one another to provide outwardly open and recessed moat volume therebetween;
   providing gate dielectric within the moat volume between adjacent isolation blocks;
   providing a layer of electrically conductive material over the substrate and gate dielectric to a thickness sufficient to completely fill the moat volume between adjacent isolation blocks;
   chemical-mechanical polishing the layer of electrically conductive material to provide a planarized upper electrically conductive material surface;
   photopatterning and etching the layer of electrically conductive material to provide an electrically conductive runner which overlies a plurality of the isolation blocks and to selectively remove the electrically conductive material from within selected regions of moat volume to define field effect transistor gates within the moat volume; and
   providing conductivity enhancing impurity through the selected regions of moat volume into the substrate to define source/drain regions adjacent the field effect transistor gates.

2. The semiconductor processing device isolation method of claim 1 wherein the electrically conductive material comprises polysilicon.

3. The semiconductor processing device isolation method of claim 1 wherein the electrically conductive material comprises polysilicon, and the device isolation blocks comprise $SiO_2$.

4. The semiconductor processing device isolation method of claim 1 wherein the layer of electrically conductive material is patterned and etched the define an electrically conductive runner which has a longitudinal extent which runs substantially laterally relative to the device isolation blocks.

5. The semiconductor processing device isolation method of claim 1 wherein the device isolation blocks have substantially vertical edges lining the moat volumes and the field effect transistor gates have substantially vertical edges within the moat volumes and the conductive runner has substantially vertical edges, and the step of providing conductivity enhancing impurity comprises in sequence;
   providing conductivity enhancing impurity to a first concentration into the substrate;
   depositing an insulating layer over the substrate;
   conducting an anisotropic spacer etch of the insulating layer to form sidewall spacers over the conductive runner edges, the field effect transistor gate edges, and over the device isolation block edges within the moat volume; and
   providing conductivity enhancing impurity to a second concentration into the substrate to substantially complete source/drain definition, the second concentration being greater than the first concentration, the sidewall spacers over the device isolation blocks effectively spacing source/drain areas of adjacent transistors further from one another than were the device isolation block spacers not provided, thus providing improved field isolation within the substrate.

6. The semiconductor processing device isolation method of claim 1 wherein the device isolation blocks have substantially vertical edges lining the moat volumes and the field effect transistor gates have substantially vertical edges within the moat volumes and the conductive runner has substantially vertical edges, and the step of providing conductivity enhancing impurity comprises in sequence;
   providing conductivity enhancing impurity to a first concentration into the substrate;
   depositing an insulating layer over the substrate;
   conducting an anisotropic spacer etch of the insulating layer to a degree sufficient to leave sidewall spacers over the field effect transistor gate edges within the moat volume, but not leave sidewall spacers over the conductive runner edges or device isolation block edges within the moat volume; and
   providing conductivity enhancing impurity to a second concentration into the substrate to substantially complete source/drain definition, the second concentration being greater than the first concentration.

7. A semiconductor processing device isolation method comprising:
   providing non-LOCOS insulating device isolation blocks by trench and refill technique on a substrate, the device isolation blocks having an outer surface and being laterally spaced from one another to provide outwardly open and recessed moat volume therebetween;
   providing gate dielectric within the moat volume between adjacent isolation blocks;
   providing a first layer of electrically conductive material over the substrate and gate dielectric to a thickness sufficient to completely fill the moat volume between adjacent isolation blocks;
   chemical-mechanical polishing the first layer of electrically conductive material to at least to the device isolation block outer surfaces to define conductive blocks which are within moat volume and are interposed between adjacent device isolation block;
   providing a second layer of electrically conductive material atop the conductive blocks and device isolation blocks;
   photopatterning and etching the second layer of electrically conductive material and conductive blocks to provide an electrically conductive runner which overlies a plurality of the isolation blocks and to selectively remove first layer material from within selected regions of moat volume to define field effect transistor gates within the moat volume; and
   providing conductivity enhancing impurity through the selected regions of moat volume into the substrate to define source/drain regions adjacent the field effect transistor gates.

8. A semiconductor processing device isolation method comprising:
   providing a sacrificial layer of a first material atop a semiconductor substrate, the sacrificial layer having an outer surface;
   patterning and etching the sacrificial layer of material and etching into the substrate to define isolation moats;

depositing an insulating material atop the patterned and etched sacrificial layer to a thickness sufficient to completely fill the isolation moats, the insulating material being different is composition from the first material;

chemical-mechanical polishing the insulating material at least to the outer surface of the patterned and etched sacrificial layer to define non-LOCOS device isolation blocks, the device isolation blocks having an outer surface and being laterally spaced from one another;

etching the patterned and etched sacrificial layer from the substrate to provide outwardly open and recessed moat volume between adjacent device isolation blocks;

providing gate dielectric within the moat volume between adjacent isolation blocks;

providing a layer of electrically conductive material over the substrate and gate dielectric to a thickness sufficient to completely fill the moat volume between adjacent isolation blocks;

chemical-mechanical polishing the layer of electrically conductive material to provide a planarized upper electrically conductive material surface;

photopatterning and etching the layer of electrically conductive material to provide an electrically conductive runner which overlies a plurality of the isolation blocks and to selectively remove electrically conductive layer material from within selected regions of moat volume to define field effect transistor gates within the moat volume; and providing conductivity enhancing impurity through the selected regions of moat volume into the substrate to define source/drain regions adjacent the field effect transistor gates.

9. The semiconductor processing device isolation method of claim 8 wherein the electrically conductive material comprises polysilicon.

10. The semiconductor processing device isolation method of claim 8 wherein the electrically conductive material comprises polysilicon, and the device isolation blocks comprise $SiO_2$.

11. The semiconductor processing device isolation method of claim 8 wherein the layer of conductive material is patterned and etched the define an electrically conductive runner which has a longitudinal extent which runs substantially laterally relative to the device isolation blocks.

12. The semiconductor processing device isolation method of claim 8 wherein the device isolation blocks have substantially vertical edges lining the moat volumes and the field effect transistor gates have substantially vertical edges within the moat volumes and the conductive runner has substantially vertical edges, and the step of providing conductivity enhancing impurity comprises in sequence;

providing conductivity enhancing impurity to a first concentration into the substrate;

depositing an insulating layer over the substrate;

conducting an anisotropic spacer etch of the insulating layer to form sidewall spacers over the conductive runner edges, the field effect transistor gate edges, and over the device isolation block edges within the moat volume; and providing conductivity enhancing impurity to a second concentration into the substrate to substantially complete source/drain definition, the second concentration being greater than the first concentration, the sidewall spacers over the device isolation blocks effectively spacing source/drain areas of adjacent transistors further from one another than were the device isolation block spacers not provided, thus providing improved field isolation within the substrate.

13. The semiconductor processing device isolation method of claim 8 wherein the device isolation blocks have substantially vertical edges lining the moat volumes and the field effect transistor gates have substantially vertical edges within the moat volumes and the conductive runner has substantially vertical edges, and the step of providing conductivity enhancing impurity comprises in sequence;

providing conductivity enhancing impurity to a first concentration into the substrate;

depositing an insulating layer over the substrate;

conducting an anisotropic spacer etch of the insulating layer to a degree sufficient to leave sidewall spacers over the field effect transistor gate edges within the moat volume, but not leave sidewall spacers over the conductive runner edges or device isolation block edges within the moat volume; and providing conductivity enhancing impurity to a second concentration into the substrate to substantially complete source/drain definition, the second concentration being greater than the first concentration.

14. A semiconductor processing device isolation method comprising:

providing a sacrificial layer of a first material atop a semiconductor substrate, the sacrificial layer having an outer surface;

patterning and etching the sacrificial layer of material and etching into the substrate to define isolation moats;

depositing an insulating material atop the patterned and etched sacrificial layer to a thickness sufficient to completely fill the isolation moats, the insulating material being different is composition from the first material;

chemical-mechanical polishing the insulating material at least to the outer surface of the patterned and etched sacrificial layer to define non-LOCOS device isolation blocks, the device isolation blocks having an outer surface and being laterally spaced from one another;

etching the patterned and etched sacrificial layer from the substrate to provide outwardly open and recessed moat volume between adjacent device isolation blocks;

providing gate dielectric within the moat volume between adjacent isolation blocks;

providing a layer of electrically conductive material over the substrate and gate dielectric to a thickness sufficient to completely fill the moat volume between adjacent isolation blocks;

chemical-mechanical polishing the layer of electrically conductive material to provide a planarized upper electrically conductive material surface;

photopatterning and etching the layer of electrically conductive material to provide an electrically conductive runner which overlies a plurality of the isolation blocks and to selectively remove the electrically conductive material from within selected regions of moat volume to define field effect transistor gates within the moat volume; and providing conductivity enhancing impurity through the selected regions of moat volume into the substrate to define source/drain regions adjacent the field effect transistor gates.

* * * * *